United States Patent
Hong et al.

(10) Patent No.: US 11,953,738 B2
(45) Date of Patent: Apr. 9, 2024

(54) DISPLAY

(71) Applicant: BenQ Materials Corporation, Taoyuan (TW)

(72) Inventors: Cyun-Tai Hong, Taoyuan (TW); Yu-Da Chen, Taoyuan (TW); Hsu-Cheng Cheng, Taoyuan (TW); Meng-Chieh Wu, Taoyuan (TW); Chuen-Nan Shen, Taoyuan (TW); Kuo-Jung Huang, Taoyuan (TW); Wei-Jyun Chen, Taoyuan (TW); Yu-Jyuan Dai, Taoyuan (TW)

(73) Assignee: BenQ Materials Corporation, Taoyuan (TW)

( * ) Notice: Subject to any disclaimer, the term of this patent is extended or adjusted under 35 U.S.C. 154(b) by 254 days.

(21) Appl. No.: 17/706,724

(22) Filed: Mar. 29, 2022

(65) Prior Publication Data
US 2023/0168446 A1 Jun. 1, 2023

(30) Foreign Application Priority Data

Dec. 1, 2021 (TW) .................................. 110144781

(51) Int. Cl.
*H10K 50/86* (2023.01)
*G02B 5/04* (2006.01)
*G02B 6/42* (2006.01)
*H10K 50/858* (2023.01)

(52) U.S. Cl.
CPC ........... *G02B 6/4214* (2013.01); *G02B 5/045* (2013.01); *H10K 50/858* (2023.02); *H10K 50/86* (2023.02)

(58) Field of Classification Search
None
See application file for complete search history.

(56) References Cited

U.S. PATENT DOCUMENTS

| 11,747,667 B2* | 9/2023 | Hong .................... G02B 5/3033 |
| | | 359/567 |
| 2016/0273724 A1* | 9/2016 | Sakuragi ................ G02B 5/045 |
| 2021/0255502 A1* | 8/2021 | Kuo .................... G02F 1/133504 |

(Continued)

FOREIGN PATENT DOCUMENTS

TW 201421115 A 6/2014

*Primary Examiner* — Rhonda S Peace

(57) ABSTRACT

The present invention discloses a display including a display panel and a light redirecting film disposed on the viewing side of the display panel. The light redirecting film comprises a light redistribution layer, and a light guide layer disposed on the light redistribution layer. The light redistribution layer includes a plurality of strip-shaped micro prisms extending along a first direction and arranged at intervals and a plurality of diffraction gratings arranged at the bottom of the intervals between the adjacent strip-shaped micro prisms, wherein each of the strip-shaped micro prisms has at least one inclined light-guide surface, and the bottom of each interval has at least one set of diffraction gratings, and the light guide layer is in contact with the strip-shaped micro prisms and the diffraction gratings. The present light redirecting film is disposed on the viewing side of the display panel to decrease the light loss in the side viewing angle of the display, and homogenize the brightness distribution at different viewing angles thereof.

15 Claims, 10 Drawing Sheets

(56) References Cited

U.S. PATENT DOCUMENTS

2023/0168446 A1\* 6/2023 Hong ..................... G02B 5/045
                                                    385/36
2023/0168533 A1\* 6/2023 Hong ................... G02B 5/1866
                                                    359/567

\* cited by examiner

DISPLAY

RELATED APPLICATIONS

This application claims priority to Taiwan Application Serial Number 110144781 filed on Dec. 1, 2021, which is herein incorporated by reference.

BACKGROUND OF THE INVENTION

Field of the Invention

The invention relates to a display having a light redirecting film, which can equalize the brightness of each viewing angle of the display, and decrease the excessive dependence of brightness on the viewing angles.

Description of the Related Art

With the developing trend of the large-size displays, especially applications in TVs or splicing display walls, even if the user is watching these displays from a front viewing angle, the contrast and brightness of the edge images and the central image of the large-size displays can still be found to be inconsistent. Not to mention that when the user is watching from a side viewing angle, the lack of overall lateral brightness, as a main reason, will cause more severe problems of color-shift and color-washout. Although today's displays, whether they are passively illuminated liquid crystal displays (LCDs), or electroluminescent displays, such as organic light-emitting diode displays (OLED displays), small-pitch LED displays, sub-millimeter light-emitting displays (mini LED displays) or micro LED displays that can actively emit light have excellent contrast characteristics at all viewing angles, the user can watch the displayed images at various viewing angles. However, the so-called contrast value is actually the ratio of a bright-state image to a dark-state image. Regarding the contrast value of the display at the side viewing angle, such as in a liquid crystal display, because the side viewing angle light has been greatly degraded, the light leakage in the dark state has also become extremely low, which still has a certain contrast value. In the electroluminescent displays, the contrast values are also high because the electroluminescent displays do not emit light in the dark state. The above-mentioned contrast value does not represent the uniformity and image quality of the bright image how the user can actually experience. Therefore, current users are not only satisfied with the minimum requirement that the displayed image can be watched at the side viewing angles and the actual image brightness is weak, but the displayed image is expected to have uniform image light and image quality at all viewing angles. In addition, current displays generally use electroluminescent diodes as image light sources, regardless of passive or active luminescence displays, such as liquid crystal displays with light-emitting diode (LED) backlights, or self-luminous organic light-emitting diode displays. Since the electroluminescent diode is a point light source with an extremely high single-point brightness, a good light guide is required to create a uniform and flicking-free overall display image. Referred to FIG. 1A, FIG. 1A is an example of brightness distribution diagrams in the horizontal viewing angle direction of a conventional liquid crystal display and an ideal liquid crystal display. It is obvious from the diagram that the intensity of the light emitted by the conventional liquid crystal display decreases sharply as the viewing angle increases. This is because the liquid crystal display is a non-active light-emitting display and the transmittance of the pixels of the display panel is low. In order to increase the intensity and efficiency of the backlight, it is often necessary to use optical structure films such as brightness enhancement film and concentrating-prism plate in the light-emitting diode backlight module for brightness enhancement, but these methods can only increase the maximum brightness of the front view, and when the light emitted by the backlight passes through the display panel, it is limited by the aperture ratio of the pixels, and will be further attenuated as the viewing angle increases. In addition, for electroluminescent displays that use their own luminous bodies directly as display pixels, due to the display side lacks the optical structure films used in the conventional backlight module such as diffusers and light-guide plates. It is easy to cause loss of light and uneven light distribution when watching from a larger side viewing angle, and it is difficult to form an ideal surface light source with equivalent brightness in each viewing angle. Therefore, the images watched from the side viewing angle cannot have the better image quality as watched from the front viewing angle, and it is especially easy to cause images with low contrast or abnormal color performance due to lack of light and insufficient brightness.

In addition, from the diagram of FIG. 1A, we can also know the brightness distribution characteristics of the conventional display. The brightness intensity in the front viewing angle range (for example, within ±30° viewing angles) is higher, and that in the side viewing angle range (for example, out of ±30° viewing angles) is greatly reduced, which does not meet the ideal normal distribution of brightness of the ideal display, and the brightness spectrum has a large tangent slope change to the viewing angle. In the conventional technology, the full width at half maximum (FWHM) of the spectral curve is increased by enhancing the normal incident intensity of the backlight, but the overall distribution characteristics of the brightness spectrum of the display cannot be changed. Therefore, it is not sufficiently representative to observe whether the brightness distribution of each viewing angle is uniform and wide with the conventional FWHM.

Also refer to FIG. 1B, it is recommended that the evaluation method should be reflected the brightness of the front viewing angle and the side viewing angle independently. For example, 75% or more of the maximum brightness of the front viewing angle of the display represents the front viewing angle range, and 40% or more of the maximum brightness of the front viewing angle of the display represents the side viewing angle range. When the front viewing angle range is not excessively reduced and restricted, the side viewing angle range can be extended and increased, so that the tangent slope of the brightness spectrum to the viewing angles changes less and shows a more ideal normal distribution curve, and the uniformity of the brightness of the display is better in all viewing angles, and the human eye can feel more uniform brightness when watching.

Known methods for improving the image quality of the side viewing angle of the display have been disclosed, for example, Taiwan Patent TWI645218 discloses a light redirecting film with two-layered grating surface to improve the color-washout or grayscale-reverse phenomenon of the liquid crystal display at a wide viewing angle. However, through actual tests, although the light redirecting film has the effect of improving the color-washout and grayscale-reverse phenomenon of images, the two-layered grating surface structure reduces the brightness of the light more, and due to the diffraction effect of the grating structure under the actual measurement, the zero-order diffraction and the first-order diffraction are relatively high. Therefore, the enhanced interference has better light deflection efficiency than refraction or scattering, but the influence is still in front viewing angle range, and the gain ratio for increasing the brightness of side viewing angle is less. For another example, Taiwan Patent TWI731590 discloses a liquid crystal display includes a color enhancement film with a strip-shaped micro-prism layer to improve the color-shift problem and saturation reduction at side viewing angles. However, under the premise that the resolution of the display is not reduced due to excessive refraction of the micro-prisms, the light-guiding angle of the strip-shaped micro-prisms is still insufficient, so it still cannot solve the problems of light loss and uneven light distribution at side viewing angle.

SUMMARY OF THE INVENTION

This invention is to provide a display, which can change the brightness distribution of the display without affecting the visual perception of the original front-view brightness of the display, extend the side viewing angle range and enhance the light quality and uniformity of the image viewed from various angles.

An aspect of this present invention is to provide a display comprising a display panel, and a light redirecting film disposed on a light-exiting side of the display panel. The light redirecting film comprises a light redistribution layer including a plurality of strip-shaped micro prisms extending along a first direction and arranged at intervals, and a plurality of diffraction gratings arranged on bottoms of the intervals between the adjacent strip-shaped micro prisms, wherein each of the strip-shaped micro prisms has at least one inclined light-guide surface, and the bottom of each interval has at least one set of diffraction gratings; and a light guide layer disposed on the light redistribution layer, and in contact with the strip-shaped micro prisms and the diffraction gratings. Herein, a front viewing angle range at 75% of the maximum brightness (VW75) refers to the viewing angle range covered by more than 75% of normalized maximum brightness relative to the vertical front viewing angle, and a side viewing angle range at 40% of the maximum brightness (VW40) refers to the viewing angle range covered by more than 40% of normalized maximum brightness relative to the vertical front viewing angle. A viewing angle extension ratio at 75% of the normalized maximum brightness of the display to the original 75% front viewing angle range ($VW75_{origin}$) without the light redirecting film is more than 1.0, and a viewing angle extension ratio at 40% of the normalized maximum brightness of the display to the original 40% side viewing angle range ($VW40_{origin}$) without the light redirecting film is more than 1.3, that is, $VW75/VW75_{origin}>1.0$, and $VW40/VW40_{origin}>1.3$.

In an embodiment of the display of this present invention, an absolute value of the maximum tangent slope of the spectrum of the normalized maximum brightness of the display varying with the viewing angles is less than $4.0 \times 10^{-2}$.

In another embodiment of the display of this present invention, the display panel is a liquid crystal display panel or an electroluminescent display panel. In an embodiment of the present invention, the electroluminescent display panel is an organic light-emitting diode display panel (OLED display panel), a small-pitch LED display panel, a sub-millimeter light-emitting display panel (mini LED display panel) or a micro LED display panel.

Another aspect of this present invention is to provide a display further comprising a polarizer disposed on a side of the light redirecting film. The polarizer can be disposed on a light-emitting side or a light-incident side of the light redirecting film.

In another embodiment of the display of this present invention, the polarizer is a linear polarizer or a circular polarizer.

In another embodiment of the display of this present invention, the light redistribution layer has a first refractive index n1; the light guide layer has a second refractive index n2; the first refractive index n1 and the second refractive index n2 are in a range of 1.4 to 1.7, and the difference between n1 and n2 is not less than 0.05.

In another embodiment of the display of this present invention, the maximum width of bottom of each of the strip-shaped micro-prisms of the light redistribution layer is in a range of 31 μm to 151 μm.

In another embodiment of the display of this present invention, the height of each of the strip-shaped micro-prisms of the light redistribution layer is in a range of 51 μm to 151 μm.

In another embodiment of the display of this present invention, the width of the bottom of the intervals between the adjacent strip-shaped micro prisms of the light redistribution layer is in a range of 31 μm to 151 μm.

In another embodiment of the display of this present invention, the top portions of the strip-shaped micro-prisms are flat, triangular, or curved.

In another embodiment of the display of this present invention, an included angle θ is formed between the inclined light-guide surface and a normal direction of the light redirecting film on the cross-section perpendicular to the first direction, and the included angle θ is more than 5° and less than 15°.

In another embodiment of the display of this present invention, the pitch of the diffraction gratings of the light redistribution layer is in a range of 0.51 μm to 3.01 μm.

In another embodiment of the display of this present invention, the height of each of the diffraction gratings of the light redistribution layer is in a range of 0.41 μm to 1.01 μm.

In another embodiment of the display of this present invention, the display further comprises a functional layer formed on a light-exiting surface of the light redirection film, wherein the functional layer is selected from one of the group consisting of a hard coating layer, an anti-reflection layer and an anti-glare layer, or combinations thereof.

The above and other aspects of the invention will become better understood with regard to the following detailed description of the preferred but non-limiting embodiment(s). The following description is made with reference to the accompanying drawings.

DETAILED DESCRIPTION OF THE INVENTION

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

In the following description, numerous specific details are described in detail in order to enable the reader to fully understand the following examples. However, embodiments of the present invention may be practiced in case no such specific details. In other cases, in order to simplify the drawings, the structure of the apparatus known only schematically depicted in figures.

Figure 1A:
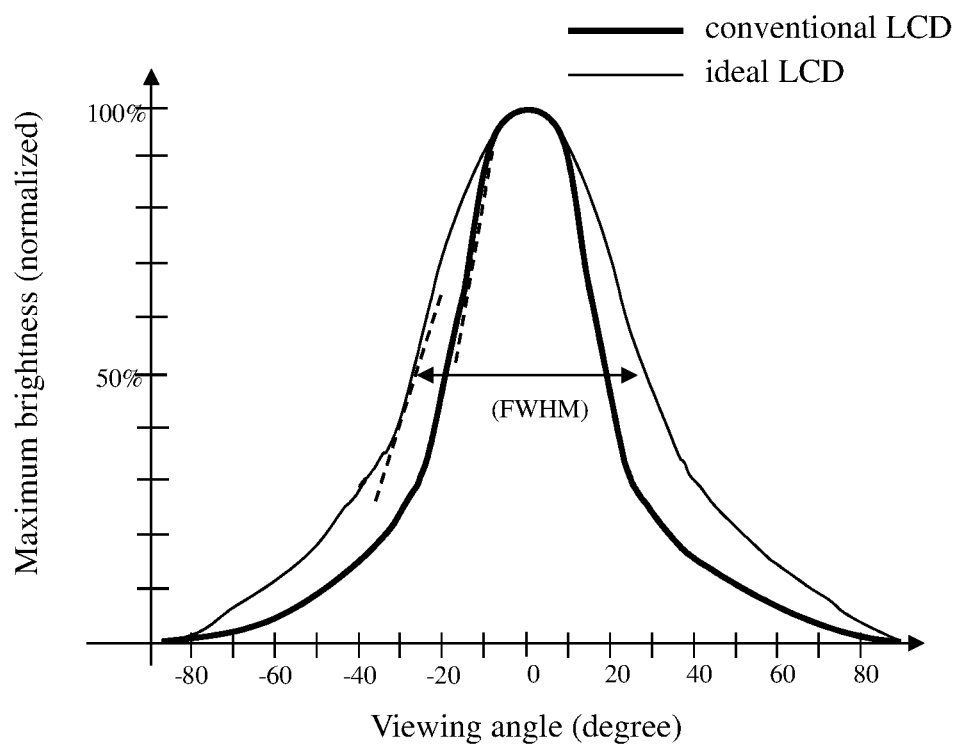
FIG. 1A and FIG. 1B illustrate light distribution diagrams of the bright state of a liquid crystal display at a horizontal viewing angle.
Figure 1B:
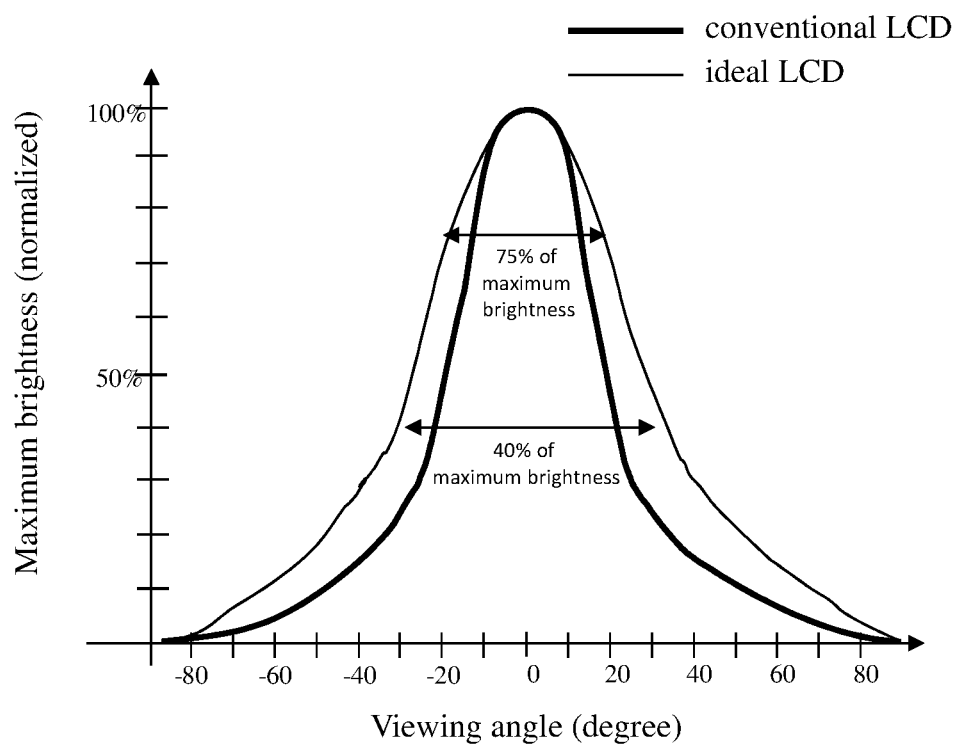
Figure 2A:
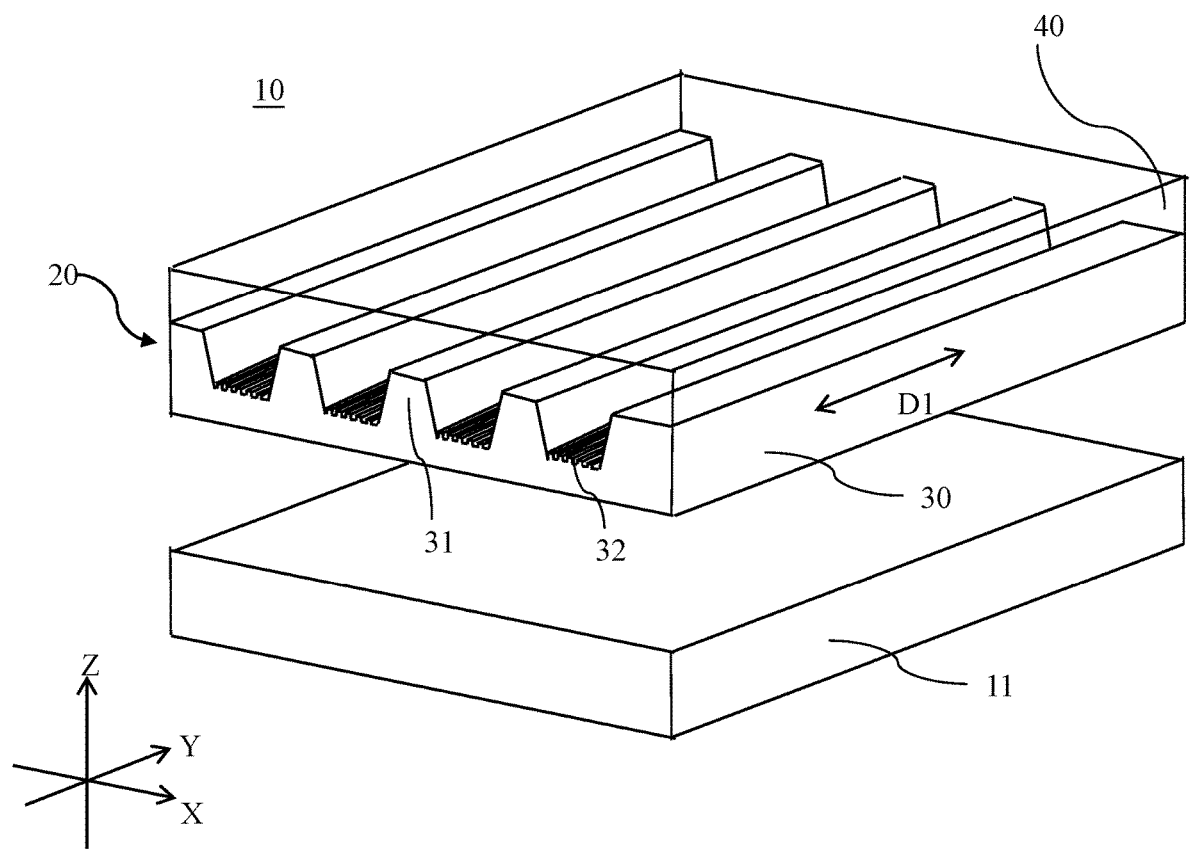
FIG. 2A is a perspective view of a display of an aspect of the present invention.
Figure 2B:
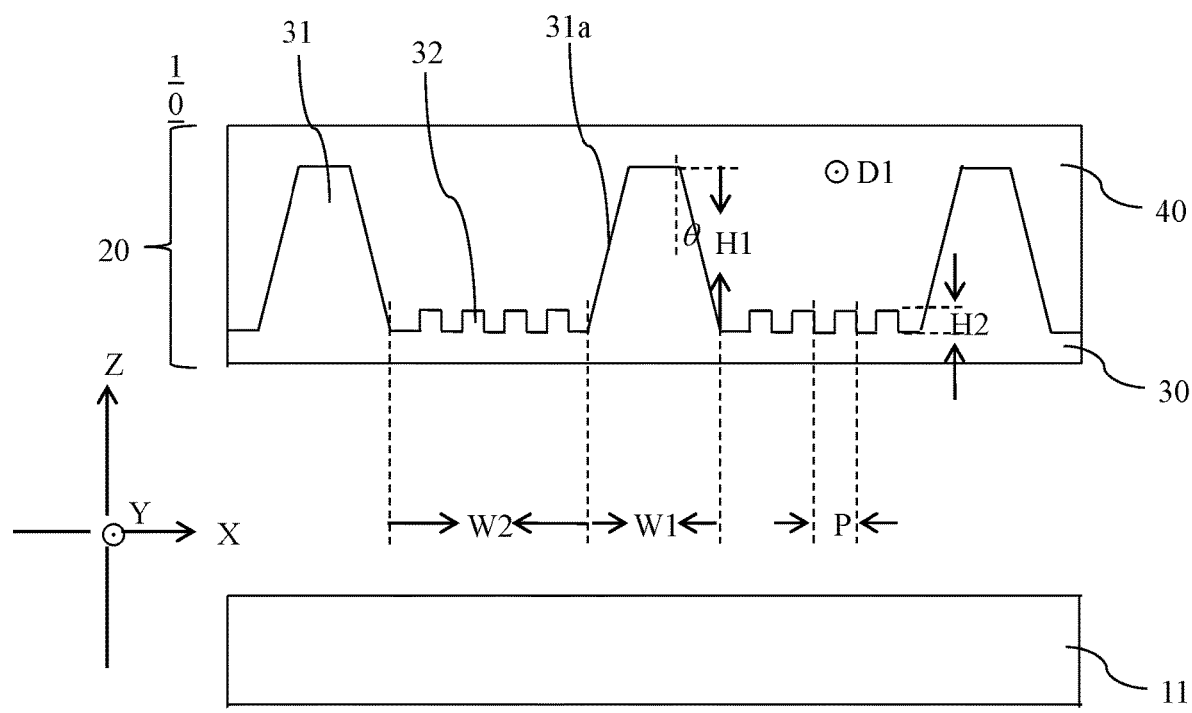
FIG. 2B is a cross-sectional view of a display of another aspect of the present invention.

Referred to FIG. 2A and FIG. 2B, FIG. 2A is a perspective view of a display of an aspect of the present invention. FIG. 2B is a cross-sectional view of a display of an aspect of the present invention along the direction perpendicular to the Y-axis. The display 10 comprises a display panel 11, and a light redirecting film 20 disposed on a light-exiting side (not shown) of the display panel 11. The light redirecting film 20 comprises a light redistribution layer 30 for receiving the image light from the display panel 11. The light redistribution layer 30 includes a plurality of strip-shaped micro prisms 31 extending along a first direction D1 and arranged at intervals, and a plurality of diffraction gratings 32 arranged on bottoms of the intervals between the adjacent strip-shaped micro prisms 31, wherein each of the strip-shaped micro prisms 31 has at least one inclined light-guide surface 31a, and the bottom of each interval has at least one set of diffraction gratings 32; and a light guide layer 40 disposed on the light redistribution layer 30, and in contact with the strip-shaped micro prisms 31 and the diffraction gratings 32. A viewing angle extension ratio at 75% of the normalized maximum brightness of the display is more than 1.0, and a viewing angle extension ratio at 40% of the normalized maximum brightness of the display is more than 1.3.

In the present invention, the front viewing angle range at 75% of the maximum brightness (VW75) refers to the viewing angle range covered by more than 75% of normalized maximum brightness relative to the vertical front viewing angle, and the side viewing angle range at 40% of the maximum brightness (VW40) refers to the viewing angle range covered by more than 40% of normalized maximum brightness relative to the vertical front viewing angle. The original front viewing angle range at 75% of the maximum brightness and the original side viewing angle range at 40% of the maximum brightness of a conventional display that does not include the light redirecting film 20 are represented by $VW75_{origin}$ and $VW40_{origin}$ respectively. The viewing angle extension ratio is the ratio of the viewing angle of the display 10 of the present invention with the light redirecting film 20 to the original viewing angle of the conventional display without the light redirecting film 20. In the display 10 of the present invention, when the image light of the display panel 11 is vertically incident to the light redirecting film 20, the image light is efficiently transmitted laterally to extend the front viewing angle range and the side viewing angle range, that is, the viewing angle extension ratio at 75% of the maximum brightness of the front viewing angle range is more than 1.0 ($VW75/VW75_{origin}>1.0$), and the viewing angle extension ratio at 40% of the maximum brightness of the side viewing angle range is more than 1.3 ($VW40/VW40_{origin}>1.3$), without degrading or limiting the brightness of the front viewing angle.

In another embodiment of the display of this present invention, the absolute value of the maximum tangent slope of the spectrum of the normalized maximum brightness of the display 100 varying with the viewing angles is less than $4.0\times10^{-2}$. When the absolute value of the maximum tangent slope is small, it means that the brightness changes more moderately with the viewing angles, and it is not easy to be perceived by the human eye and to affect the visual perception.

The display panel that can be used in the present invention is not limited by the light-emitting mechanism thereof. The display panel with the light redirecting film can improve the light distribution of the bright-state image of the display, especially for the display panels that the difference of the maximum brightness of L255 gradation between the front viewing angle and the side viewing angle is large, or the brightness changes rapidly with the viewing angles. In an embodiment of the display of this present invention, the display panel 11 is a liquid crystal display panel or an electroluminescent display panel. In an embodiment of the present invention, the electroluminescent display panel is an organic light-emitting diode display panel (OLED display panel), a small-pitch LED display panel, a sub-millimeter light-emitting display panel (mini LED display panel) or a micro LED display panel As shown in FIG. 2B, in a preferred embodiment of the light redirecting film 20 included in the display of the present invention, the maximum width W1 of bottom of each of the strip-shaped micro-prisms 31 of the light redistribution layer 30 is in a range of 31 μm to 151 μm. The height H1 of each of the strip-shaped micro-prisms 31 is in a range of 51 μm to 151 μm. The width W2 of the bottom of the intervals between the adjacent strip-shaped micro prisms 31 is in a range of 31 μm to 151 μm. In the embodiment of the light redirecting film 20 included in the display of the present invention, the height H1 of the strip-shaped micro-prisms 31 is used to provide the light deflected by the diffraction gratings 32 to pass through obliquely. The maximum width W1 of the bottom of the strip-shaped micro-prisms 31 and the width W2 of the bottom of the interval of the adjacent strip-shaped micro-prisms 31 can be adjusted according to the intensity and ratio of the lateral light source required by the actual application of the display panel 11.

In an embodiment of the display of this present invention, the top portions of the strip-shaped micro-prisms 31 are not limited to flat, triangular, or curved, so as not to cause the bright image of the display to flicker. In a preferred embodiment of the present invention, the top portions of the strip-shaped micro-prisms 31 of the light redirecting film 20 are flat.

In an embodiment of the display of this present invention, an included angle θ is formed between the inclined light-guide surface 31a of the strip-shaped micro-prism 31 of the light redirecting film 20 and a normal direction of the light redirecting film 20 on the cross-section perpendicular to the first direction D1. The included angle θ is preferably not less than 5°, which is used to provide a sufficient light-guide incident surface to receive light from passing through the diffraction gratings 32, and not more than 15°, so as to have the basic light guiding effect of linear variation.

In an embodiment of the display of this present invention, the maximum width W1 of bottom of each of the strip-shaped micro-prisms 31, the height H1 of each of the strip-shaped micro-prisms 31, the width W2 of the bottom of the intervals, and the included angle θ of the strip-shaped micro-prisms 31 of the light redirecting film 20 may independently design to be all the same or partly the same, and vary depending on the pixel arrangement, pixel size, overall requirements, or product design requirements of different display panels 11. Therefore, the adjacent inclined light-guide surfaces 31a can be symmetrical or asymmetrical.

In another embodiment of the display of this present invention, the pitch P of the diffraction gratings 32 of the light redistribution layer 30 is in a range of 0.51 μm to 3.01 μm, and the height H2 of each of the diffraction gratings 32 of the light redistribution layer 30 is in a range of 0.41 μm to 1.01 μm. When the pitch P and the height H2 of the diffraction gratings 32 are smaller than the width and height of the strip-shaped micro-prisms 31, relatively more diffraction effects can be generated without affecting the image resolution. Moreover, the sizes of the diffraction gratings 32 are not lower than the wavelength of visible light, so there is no sub-wavelength effect, which affects the degree of reflection and penetration of visible light at the interface of the diffraction gratings 32, and causes unexpected design variables by the discontinuity of the diffraction effect.

The light redirecting film 20 of the display of the present disclosure uses curable resins with different refractive indexes to form the light redistribution layer 30 and the light guide layer 40. In the interface between the light redistribution layer 30 and the light guide layer 40, the diffraction gratings 32 have a strong diffraction effect, and thus the entering light can be split for the first time. The light splitting effect of the diffraction gratings 32 relates to the pitch and height of the gratings, and is not significantly affected by the light path firstly passing through the resin layer with a high refractive index and then passing through the resin layer with a low refractive index, or by passing through the resin layer with a low refractive index firstly and then through the resin layer with a high refractive index. However, the refractive index difference between the two curable resins should be existed. Therefore, the first refractive index n1 of the light redistribution layer 30 can be selected to be greater than or less than the second refractive index n2 of the light guide layer 40. In an embodiment of the present invention, the first refractive index n1 and the second refractive index n2 are between 1.4 and 1.7, and the difference between the first refractive index n1 and the second refractive index n2 is not less than 0.05 and not greater than 0.3.

Figure 3:
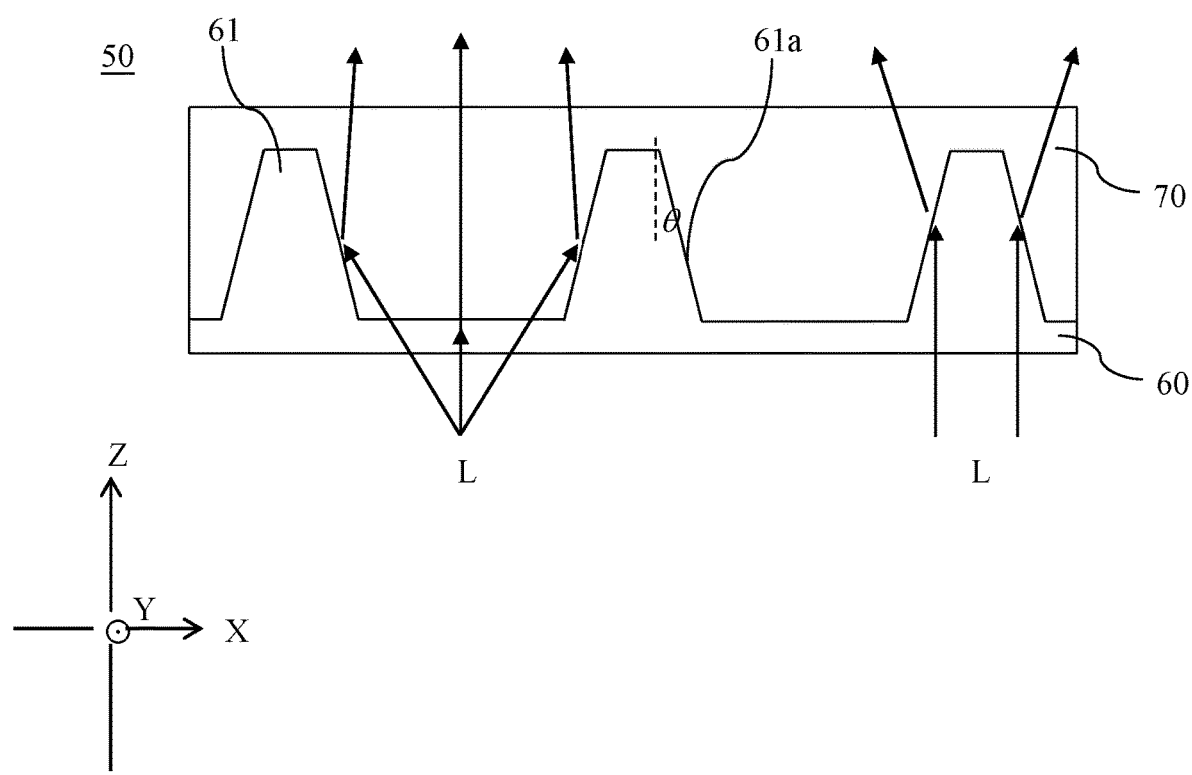
FIG. 3 is a schematic diagram of a light guiding effect of a conventional color improvement film with only a strip-shaped micro-prism layer.

Referring to FIG. 3, which is a schematic diagram of a light guiding effect of a conventional color enhancement film 50 with only a strip-shaped micro-prism layer 60. The conventional color enhancement film 50 uses the refractive index difference between the strip-shaped micro-prism layer 60 and the filling layer 70 and the inclined light-guide surfaces 61a of the plurality of strip-shaped micro-prisms 61 to make the light L entering the strip-shaped micro-prism layer 60 be deflected to improve the color-shift problem and saturation reduction at side viewing angles. However, because as the light L is incident at the front viewing angle, the deflection of the light L occurs only when passing through the inclined light-guide surfaces 61a. Thereby under the trend of thinner displays, it relies on increasing the included angle θ between the inclined light-guide surfaces 61a and the normal direction of the film surface to change the proportion of light that can pass through the inclined light-guide surfaces 61a, or on increasing the refractive index difference between the strip-shaped micro-prism layer 60 and the filling layer 70 to enhance the degree of deflection of the incident light. It is still difficult to have the optical materials with special extremely high refractive index or extremely low refractive index. Therefore, it is hard to transmit the light to the side viewing angle to improve the brightness distribution difference between the side viewing angle range and the front viewing angle range.

Figure 4:
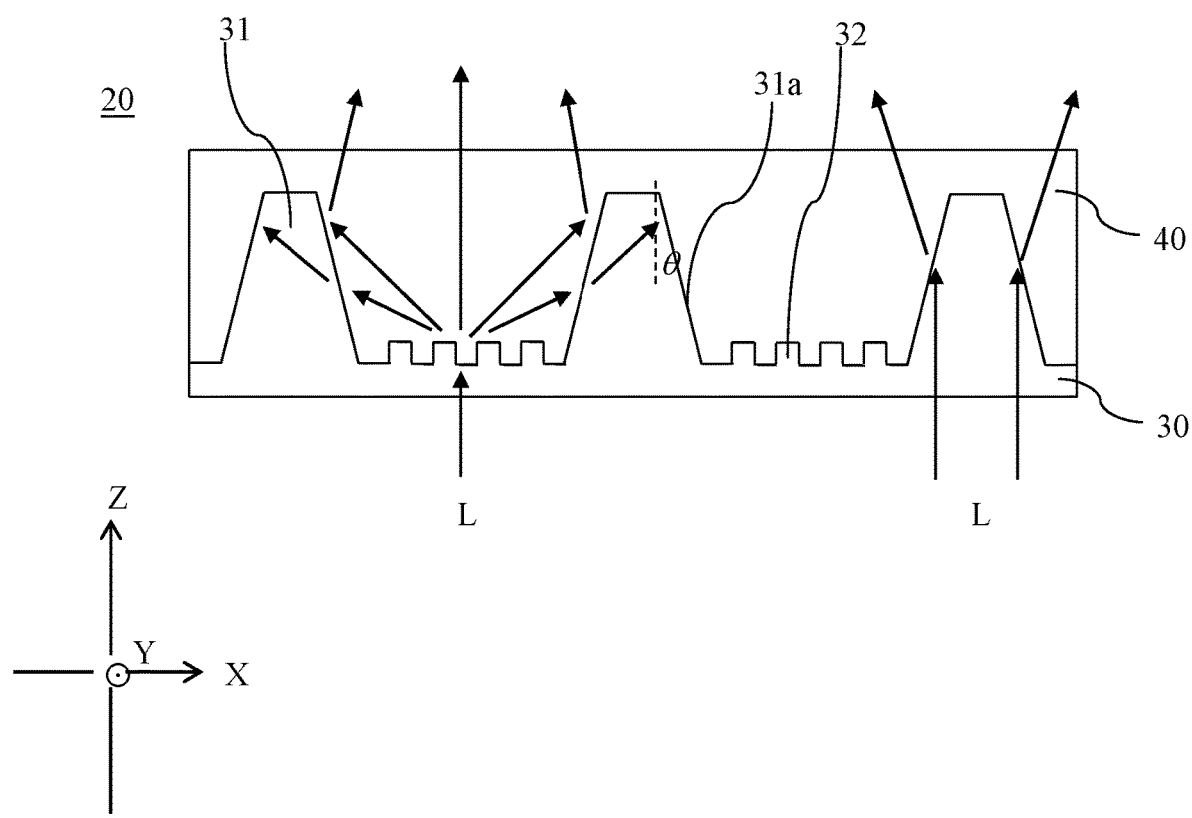
FIG. 4 is a schematic diagram of a light guiding effect of a light redirecting film of a display of a preferred embodiment of the present invention.

FIG. 4 is a schematic diagram of a light guiding effect of a light redirecting film 20 of the display 10 of the present invention. In a preferred embodiment of the present invention, the light redistribution layer 30 of the light redirecting film 20 is disposed on the light incident side of the light L, and the light guide layer 40 is disposed on the light exiting side. The light redistribution layer 30 includes not only a plurality of strip-shaped micro-prisms 31, but also a plurality of diffraction gratings 32 arranged at bottoms of the intervals between the adjacent strip-shaped micro-prisms 31. Without increasing the overall thickness of the light redirecting film 20, the incident light L directly passes through the inclined light-guide surfaces 31a, and passes through the diffraction grating 32. The light L which is undeflected when passing through bottoms of the intervals of the strip-shaped micro-prisms 31 can also be diffracted and deflected first, and then obliquely enter the inclined light-guide surface 31a in the light guide layer 40, so as to increase the light guide path without increasing the overall thickness of the light redirecting film 20. The light is refracted, diffracted or reflected to a larger angle by the adjacent inclined light-guide surfaces 31a and the diffraction gratings 32, so that the intensity of the light decreases naturally with the increased deflection times at the lateral viewing angle, and the difference of brightness distribution of the side viewing angle range and the front viewing angle range can be reduced to obtain a stronger lateral light guide and homogenization effect.

Figure 5A:
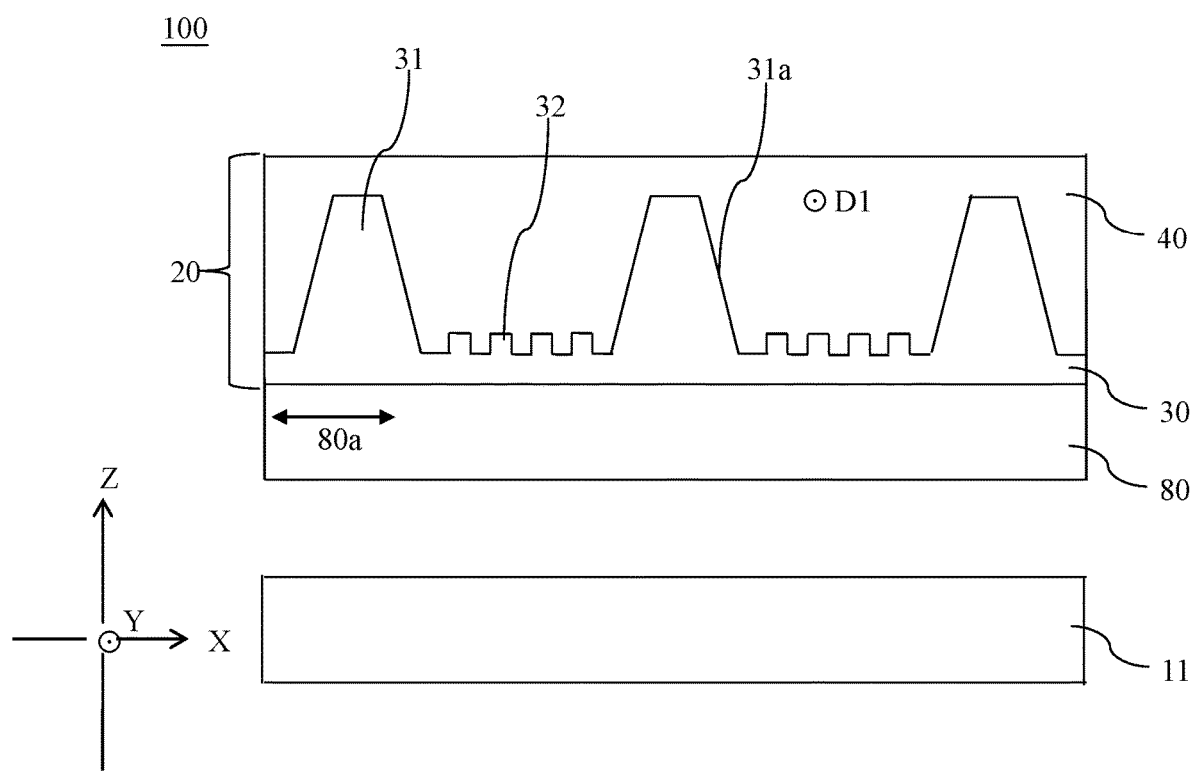
FIG. 5A and FIG. 5B are schematic diagrams of displays of another aspects of the present invention.
Figure 5B:
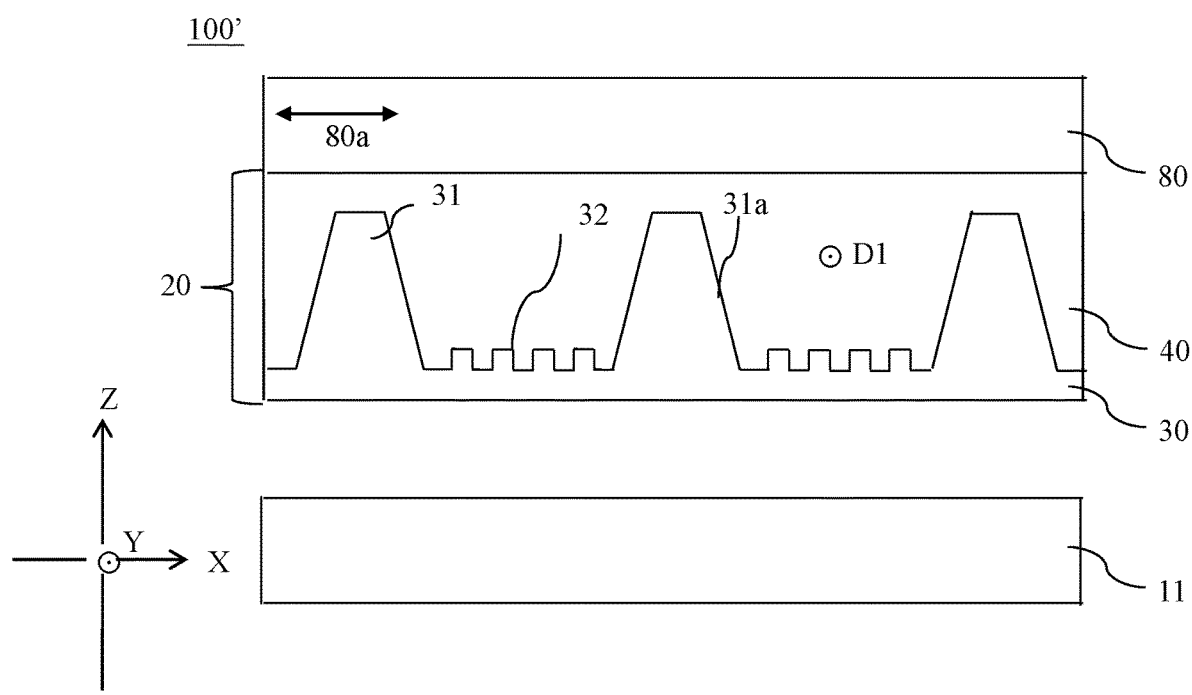

Referring to FIG. 5A and FIG. 5B, in an aspect of the display of this present invention, the displays 100 and 100' both further comprise a polarizer 80 disposed on a side of the light redirecting film 20. The polarizer 80 can be selectively adjacent to the light redistribution layer 30 or the light guide layer 40 of the light redirecting film 20. Referred to FIG. 5A, when the polarizer 80 is disposed adjacent to the light redistribution layer 30, the total in-plane retardation (Re) of the light redirecting film 20 should preferably be less than 10 nm or greater than 3000 nm. Referred to FIG. 5B, when the polarizer 80 is disposed adjacent to the light guide layer 40, the total in-plane retardation (Re) of the light redirecting film 20 should preferably be less than 10 nm or close to 0 to avoid deviated contrast or other characteristics of the display 100', or uneven phenomena such as rainbow fringes caused by the light redirecting film 20 when the polarizer 80 itself needs to have a specific retardation value.

In another embodiment of the display of this present invention, the polarizer 80 can be a linear polarizer or a circular polarizer. If the polarizer 80 is a linear polarizer, the polarizer 80 can preferably be arranged adjacent to the light redistribution layer 30, and the polarizer 80 can also be acted as a substrate used in the forming process of the first curable resin of the light redistribution layer 30. The light redirecting film 20 can also be used as a protective layer of the polarizer 80, and the first direction D1 (Y-axis direction) in which the strip-shaped micro-prisms 31 and the diffraction gratings 32 extended, and the absorption axis 80a of the polarizer 80 intersect at an angle between 90°±25°, so as to increase the brightness of the horizontal side viewing angle and brightness homogenization effect of each horizontal viewing angle. If the polarizer 80 is a circular polarizer, whether the polarizer 80 is arranged adjacent to the light redistribution layer 30 or the light guide layer 40, the polarizer 80 can also reduce the degree of reflection of ambient light on the display panel 11 of the display 100 or 100'. The improvement effect is better, especially for electroluminescent display panels or transflective liquid crystal displays with serious electrode reflection.

Figure 6:
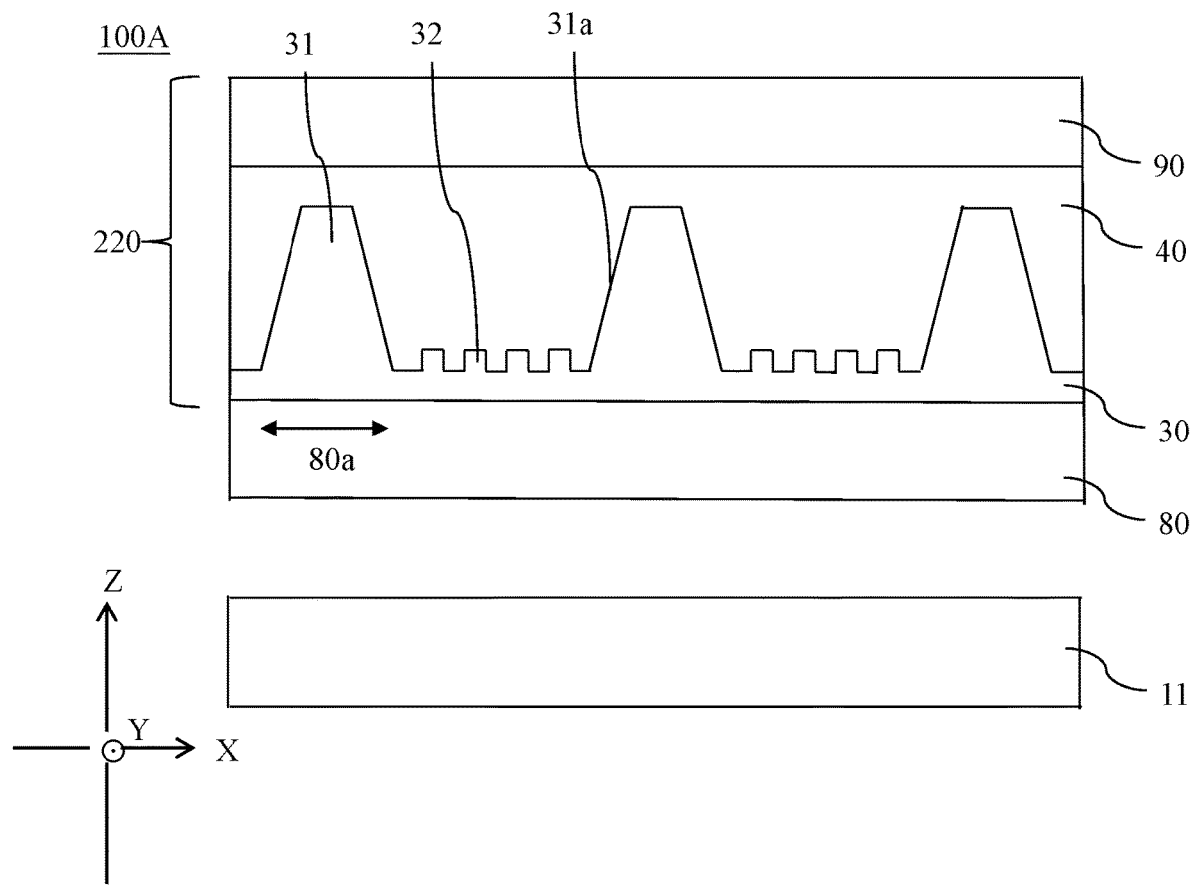
FIG. 6 is a schematic diagram of a display of another preferred embodiment of the present invention.

FIG. 6 is another embodiment of the display 100A of this present invention, which is further modified from the display 100 shown in FIG. 5A, wherein the light redirecting film 220 is adjacent to the polarizer 80 with the light redistribution layer 30. The light redirecting film 220 of the display 100A disclosed in FIG. 6 further comprises a functional layer 90 formed on the surface of the light guiding layer 40 of the light redirecting film 220, wherein the functional layer 90 is selected from one of the group consisting of a hard coating layer, an anti-reflection layer, and an anti-glare layer, or combinations thereof. In a preferred embodiment of the present invention, the functional layer 90 can be the substrate used in the forming process of a second curable resin of the light guide layer 40, and other functional surface treatment can be appropriately added to the surface of the substrate as required. In another embodiment of the present invention, the functional layer 90 can be a protective layer on the outside of the light redirecting film 220.

There are no restrictions on the manufacturing method and the sequence of formation of the light redirecting film 20 of the display 10 of the present disclosure. In an embodiment of this present invention, the light redirecting film 20 can be formed by a mold, an engraving roller, etc. to form the strip-shaped micro-prisms 31 and the diffraction gratings 32. For example, a first curable resin (not shown) with a first refractive index n1 can be embossed by a mold, an engraving roller, etc., to form the plurality of strip-shaped micro-prisms 31 and diffraction gratings 32 extending in the same direction. After curing the first curable resin to form the light redistribution layer 30, a second curable resin (not shown) with a second refractive index n2 can be filled on the embossed surface of the light redistribution layer 30 and flattened to form the light guide layer 40. In another embodiment of the present invention, the second curable resin (not shown) with the second refractive index n2 used as the light guide layer 40 can also be embossed by using a mold, an engraving roller, etc. with a reverse structure to form strip-shaped micro-prisms 31 with reverse corresponding structures and a plurality of diffraction gratings 32 extending in the same direction. After curing the second curable resin, the first curable resin (not shown) with the first refractive index n1 can be filled on the embossed surface of the light guide layer 40 and flattened to form the light redistribution layer 30. The first curable resin and the second curable resin may be a photo-curable resin or a thermo-curable resin, for example, an acrylic resin, a silicone resin, a polyurethane resin, an epoxy resin, or combinations thereof.

The stripe-shaped micro-prisms 31 and the diffraction gratings 32 extending in the same direction of the light redirecting film 20 of the present disclosure can also be formed by coating a first curable resin (not shown) with a first refractive index n1 on a substrate, and then emboss the first curable resin by a mold, a engraving roller, etc. After curing the first curable resin to form the light redistribution layer 30, a second curable resin with a second refractive index n2 can be filled on the embossed surface of the light redistribution layer 30 and flattened to form the light guide layer 40. In another embodiment of the present invention, the second curable resin (not shown) with the second refractive index n2 used as the light guide layer 40 can also be coated on a substrate and then embossed by using a mold, an engraving roller, etc. with a reverse structure to form strip-shaped micro-prisms 31 with reverse corresponding structures and a plurality of diffraction gratings 32 extending in the same direction. After curing the second curable resin, the first curable resin (not shown) with the first refractive index n1 can be filled on the embossed surface of the light guide layer 40 and flattened to form the light redistribution layer 30. After the light redistribution layer 30 and the light guide layer 40 are manufactured, the substrate may be retained or removed. In the embodiment of using the substrate for the manufacturing process of light redirecting film, the substrate can be a transparent substrate usually used in this technical field, such as a polyethylene terephthalate film (PET), a triacetate cellulose film (TAC), a polymethyl methacrylate film (PMMA), etc.

The present invention will be described below with reference to Examples to describe the present invention in detail but the present invention is not limited to the description thereof.

EXAMPLE

Example 1, Example 2 and Example 3

Examples 1 to 3 disclose displays with different light redirecting films, which are adhered to the same polarizers by using adhesive layers, and the light redirecting films are laminated on the light-emitting surface of the same liquid crystal display panel (model: AUO, VP229DA) to eliminate the influence of the air layer interfaces. The sizes of the strip-shaped micro-prisms and the diffraction gratings of the light redistribution layers of the light redirecting films, the refractive index of the materials, and the included angles of the inclined light-guide surfaces of the Examples are shown in Table 1. The absorption axes of the polarizers are in horizontal viewing angle direction, and the included angles between the first directions in which the strip-shaped micro prisms of the light redistribution layers extend and the absorption axes of the polarizers are both 105° to generate enough horizontal lateral light guide effect, and to avoid the diffraction moire or abnormal light spots generated by the mismatching of the microstructure in the light redirection film and the pixel period of the liquid crystal display panel.

COMPARATIVE EXAMPLE

Comparative Example 1

The liquid crystal display panel and polarizer used in the display of Comparative Example 1 are the same as those used in Examples 1 to 3, but the polarizer is not laminated with any optical film with light-guiding structures such as strip-shaped micro-prisms or diffraction gratings.

Comparative Example 2 and Comparative Example 3

The displays of Comparative Example 2 and Comparative Example 3 use the color enhancement films with strip-shaped micro-prisms as illustrated in FIG. 3 to be laminated on the same polarizers and liquid crystal display panels as in the Examples, and the attachment methods and the included angles between the absorption axes of the polarizers are the same as in the Examples. The sizes of the strip-shaped micro-prisms of the color enhancement films, the refractive index, and the included angles of the inclined light-guide surfaces of the Comparative Example 2 and Comparative Example 3 are shown in Table 1.

Comparative Example 4

The display of Comparative Example 4 adopts the same attachment method as Example 1 to laminate an optical film with diffraction grating structures on the same polarizer and liquid crystal display panel as the Examples. The sizes of the diffraction grating structure are shown in Table 1.

strip-shaped micro-prisms structures, even though the height of the strip-shaped micro-prisms has been greatly increased to increase its receiving ability of lateral light on the inclined light-guide surface, however, the maximum coverage angle range of the side viewing angle with a brightness of more than 40% can only reach 78°. Although the maximum tangent slope of the brightness curve with viewing angles can be reduced, the coverage angle of the front viewing angle range with brightness above 75% has been slightly reduced, and it is difficult to expect that the lateral light guiding effect can be further improved by continuously increasing the thickness of the structure. For Comparative Example 4, which only has diffraction gratings structures, although the front viewing angle range is not affected, the effect of diffracting light to the side viewing angle range is not well. From the measured values in Table 2 and the spectrums of the maximum brightness change with viewing

TABLE 1

|  | Example 1 | Example 2 | Example 3 | Comparative Example 1 | Comparative Example 2 | Comparative Example 3 | Comparative Example 4 |
|---|---|---|---|---|---|---|---|
| Height, H1 (µm) | 9.5 | 9.5 | 10.0 | — | 5.0 | 15.0 | — |
| Width, W1 (µm) | 7.5 | 7.5 | 7.5 | — | 6.5 | 10.8 | — |
| Width, W2 (µm) | 6.2 | 6.2 | 7.2 | — | 4.0 | 10.4 | — |
| Included angle, θ | 9.5° | 9.5° | 11.5° | — | 7.5° | 9° | — |
| Pitch, P (µm) | 2.0 | 1.0 | 1.0 | — | — | — | 2.0 |
| Height, H2 (µm) | 0.5 | 0.5 | 0.5 | — | — | — | 1.0 |
| first refractive index, n1 | 1.47 | 1.45 | 1.45 | — | 1.6 | 1.5 | 1.5 |
| second refractive index, n2 | 1.6 | 1.6 | 1.6 | — | 1.5 | 1.62 | 1.62 |

Figure 7:
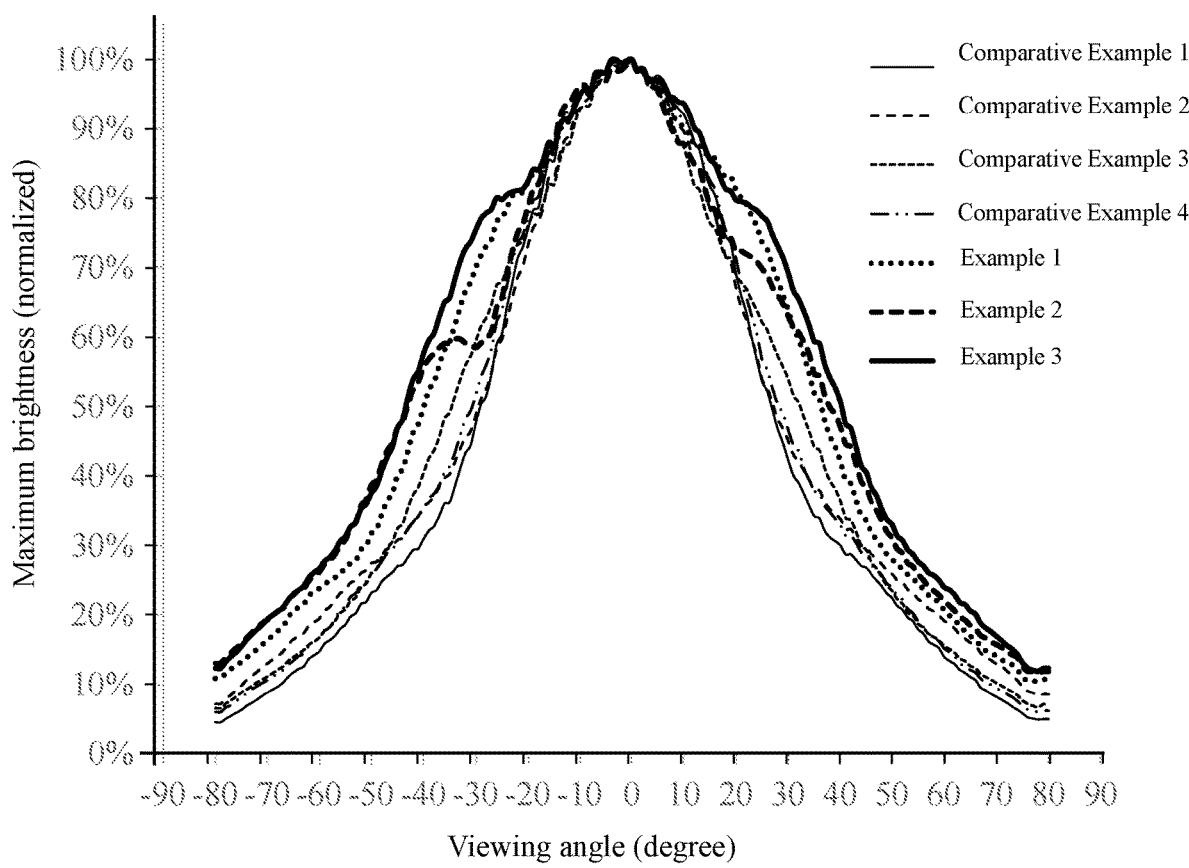
FIG. 7 is a normalized spectrum of the measured maximum brightness of the display varying with the viewing angles.

The displays of the above-mentioned Examples and Comparative Examples were measured with a panel measuring instrument, Autronic Melchers GmbH Mechanics, ConoScope 80, respectively, to measure variation of the maximum brightness of L255 gradation with the viewing angles in the horizontal viewing angle direction. The normalized spectrums are shown in FIG. 7. The measured results are shown in Table 2.

angles in FIG. 7, the display of the Comparative Example 1 without any light-guiding structure film is used as a comparison, and its normalized maximum brightness above 40% represents the original side viewing angle range at 40% of the normalized maximum brightness ($VW40_{origin}$) and its normalized maximum brightness above 75% represents the original front viewing angle range at 75% of the normalized maximum brightness ($VW75_{origin}$). Examples 1 to 3 can

TABLE 2

|  | Example 1 | Example 2 | Example 3 | Comparative Example 1 | Comparative Example 2 | Comparative Example 3 | Comparative Example 4 |
|---|---|---|---|---|---|---|---|
| Maximum brightness | 266.32 | 248.99 | 239.58 | 309.73 | 277.78 | 271.23 | 284.54 |
| The front viewing angle range at 75% of the maximum brightness (VW75) | 51° | 44° | 62° | 38° | 36° | 36° | 39° |
| Viewing angle extension ratio at 75% of the maximum brightness | 1.34 | 1.15 | 1.63 | 1.0 | 0.95 | 0.95 | 1.03 |
| The side viewing angle range at 40% of the maximum brightness(VW40) | 86° | 93° | 95° | 64° | 68° | 78° | 70° |
| Viewing angle extension ratio at 40% of the maximum brightness | 1.34 | 1.45 | 1.48 | 1.0 | 1.06 | 1.22 | 1.09 |
| Absolute value of the maximum tangent slope | $3.1 \times 10^{-2}$ | $3.7 \times 10^{-2}$ | $3.2 \times 10^{-2}$ | $4.3 \times 10^{-2}$ | $4.1 \times 10^{-2}$ | $3.2 \times 10^{-2}$ | $3.9 \times 10^{-2}$ |

The measured result data in Table 2 obviously shows that: the displays having the color enhancement films with only a strip-shaped micro-prisms film used in Comparative Example 2 and Comparative Example 3, and the display with only a diffraction gratings optical film used in Comparative Example 4 are difficult to simultaneously increase the coverage angle range of the side viewing angle and reduce the maximum tangent slope of the brightness spectrum on the liquid crystal display, compared with the display without any light guide structure in Comparative Example 1. Especially in Comparative Example 3, which only has effectively extend and expand the viewing angles, especially when the normalized maximum brightness is above 40%, the efficiency of improving the side viewing angle range (VW40) is extremely significant, and the viewing angle extension ratio at 40% of the normalized maximum brightness of the side viewing angle range $VW40/VW40_{origin}$ is more than 1.3. For the normalized maximum brightness above 75% of the front viewing angle range (VW75), the viewing angle extension ratio at 75% of the normalized maximum brightness of the front viewing angle range $VW75/VW75_{origin}$ is more than 1.0, which is still better than the original viewing angle without limiting the original front viewing angle range. Only a peak value of the maximum brightness L255 gradation of the front viewing angle is reduced and the light is efficiently guided and distributed to the side viewing angle uniformly, and absolute value of the maximum tangent slope of the spectrum of the brightness changing with the viewing angles can be kept less than $4.0 \times 10^{-2}$, so that the bright state spectrum of the display is close to an ideal normal distribution curve.

While the invention has been described by way of example(s) and in terms of the embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display, comprising:
    a display panel; and
    a light redirecting film disposed on a light-exiting side of the display panel, comprising:
        a light redistribution layer including:
            a plurality of strip-shaped micro prisms extending along a first direction and arranged at intervals; and
            a plurality of diffraction gratings arranged on bottoms of the intervals between the adjacent strip-shaped micro prisms, wherein each of the strip-shaped micro prisms has at least one inclined light-guide surface, and the bottom of each interval has at least one set of the diffraction gratings; and
        a light guide layer disposed on the light redistribution layer, and in contact with the strip-shaped micro prisms and the diffraction gratings;
    wherein a viewing angle extension ratio at 75% of the normalized maximum brightness of the display is more than 1.0, and a viewing angle extension ratio at 40% of the normalized maximum brightness of the display is more than 1.3.

2. The display as claimed in claim 1, wherein an absolute value of the maximum tangent slope of the spectrum of the normalized maximum brightness of the display varying with the viewing angles is less than $4.0 \times 10^{-2}$.

3. The display as claimed in claim 1, wherein the display panel is a liquid crystal display panel or an electroluminescent display panel.

4. The display as claimed in claim 3, wherein the electroluminescent display panel is an organic light-emitting diode display panel (OLED display panel), a small-pitch LED display panel, a sub-millimeter light-emitting display panel (mini LED display panel) or a micro LED display panel.

5. The display as claimed in claim 1, further comprising a polarizer disposed on a side of the light redirecting film.

6. The display as claimed in claim 5, wherein the polarizer is a linear polarizer or a circular polarizer.

7. The display as claimed in claim 1, wherein the light redistribution layer has a first refractive index n1, the light guide layer has a second refractive index n2, the first refractive index n1 and the second refractive index n2 are in a range of 1.4 to 1.7, and the difference between n1 and n2 is not less than 0.05.

8. The display as claimed in claim 1, wherein the bottom of each of the strip-shaped micro-prisms of the light redistribution layer has a maximum width in a range of 3 μm to 15 μm.

9. The display as claimed in claim 1, wherein the height of each of the strip-shaped micro-prisms of the light redistribution layer is in a range of 5 μm to 15 μm.

10. The display as claimed in claim 1, wherein the width of the bottom of the intervals between the adjacent strip-shaped micro prisms of the light redistribution layer is in a range of 3 μm to 15 μm.

11. The display as claimed in claim 1, wherein the top portions of the strip-shaped micro-prisms are flat, triangular, or curved.

12. The display as claimed in claim 1, wherein an included angle θ is formed between the inclined light-guide surface and a normal direction of the light redirecting film on the cross-section perpendicular to the first direction, and the included angle θ is more than 5° and less than 15°.

13. The display as claimed in claim 1, wherein the pitch of the diffraction gratings of the light redistribution layer is in a range of 0.5 μm to 3.0 μm.

14. The display as claimed in claim 1, wherein the height of each of the diffraction gratings of the light redistribution layer is in a range of 0.4 μm to 1.0 μm.

15. The display as claimed in claim 1, further comprising a functional layer formed on a light-exiting surface of the light redirecting film, wherein the functional layer is selected from one of the group consisting of a hard coating layer, an anti-reflection layer and an anti-glare layer, or combinations thereof.

* * * * *